US007200069B2

(12) United States Patent
Jang et al.

(10) Patent No.: US 7,200,069 B2
(45) Date of Patent: Apr. 3, 2007

(54) SEMICONDUCTOR MEMORY DEVICE HAVING EXTERNAL DATA LOAD SIGNAL SYNCHRONOUS WITH DATA STROBE SIGNAL AND SERIAL-TO-PARALLEL DATA PREFETCH METHOD THEREOF

(75) Inventors: Seong-Jin Jang, Sungnam (KR); Jin-Seok Kwak, Suwon (KR)

(73) Assignee: Samsung Electronics Co., Ltd. (KR)

( * ) Notice: Subject to any disclaimer, the term of this patent is extended or adjusted under 35 U.S.C. 154(b) by 253 days.

(21) Appl. No.: 10/273,512

(22) Filed: Oct. 18, 2002

(65) Prior Publication Data

US 2003/0217225 A1      Nov. 20, 2003

(30) Foreign Application Priority Data

May 17, 2002    (KR)    ............... 2002-27277

(51) Int. Cl.
*G06F 12/00* (2006.01)
(52) U.S. Cl. ............... 365/233; 365/193; 710/71; 713/400; 711/105; 711/167
(58) Field of Classification Search ............... 711/105, 711/154, 167, 168; 713/400, 500, 600; 365/193, 365/233, 189.05; 710/71
See application file for complete search history.

(56) References Cited

U.S. PATENT DOCUMENTS

| 5,430,687 | A | * | 7/1995 | Hung et al. ............ 365/230.08 |
| 5,805,504 | A | | 9/1998 | Fujita ..................... 365/189.05 |
| 6,317,369 | B1 | | 11/2001 | Kubo et al. ................. 365/193 |
| 6,317,372 | B1 | | 11/2001 | Hayashi et al. ............. 365/201 |
| 6,341,326 | B1 | | 1/2002 | Zhao et al. ................. 711/104 |
| 6,359,946 | B1 | * | 3/2002 | Ryan ........................... 375/371 |
| 2001/0004335 | A1 | | 6/2001 | Murakami ................... 365/233 |
| 2002/0005793 | A1 | * | 1/2002 | Koga .......................... 341/100 |
| 2003/0026161 | A1 | * | 2/2003 | Yamaguchi et al. ... 365/230.03 |
| 2003/0158981 | A1 | * | 8/2003 | LaBerge ..................... 710/100 |

FOREIGN PATENT DOCUMENTS

KR     01-70296     7/2001

* cited by examiner

*Primary Examiner*—Hong Kim
(74) *Attorney, Agent, or Firm*—Mills & Onello LLP

(57) ABSTRACT

A semiconductor memory system, a memory control circuit and a semiconductor memory device are disclosed. The system includes a memory control circuit for generating a data strobe signal and a data load signal in synchronization with each other. The memory circuit, which can be an SDRAM memory circuit, receives the data strobe signal and the data load signal and writes data in response to the two synchronous signals. Because the signal are synchronous, parameters introduced by timing variations caused by different signal domains are eliminated. As a result, high-frequency operation of the system is greatly improved.

21 Claims, 11 Drawing Sheets

SEMICONDUCTOR MEMORY DEVICE HAVING EXTERNAL DATA LOAD SIGNAL SYNCHRONOUS WITH DATA STROBE SIGNAL AND SERIAL-TO-PARALLEL DATA PREFETCH METHOD THEREOF

RELATED APPLICATION

This application relies for priority on Korean Application No. 2002-27277, filed May 17, 2002, the contents of which are incorporated herein in their entirety by reference.

FIELD OF THE INVENTION

The invention is directed in general to semiconductor memory devices and, more specifically, to a synchronous semiconductor memory device having an external data load signal and a serial-to-parallel data prefetch method.

BACKGROUND OF THE INVENTION

The operational speed and performance of an SDRAM (synchronous dynamic random access memory) is better than that of a DRAM (dynamic random access memory) which operates asynchronously, when the SDRAM is operated in synchronization with an external system clock and there are frequent sequential data read/write operations.

The operational speed and performance of the SDRAM is further improved when both the rising and falling edges of the system clock is used in reading and writing data, i.e., the clock rate is effectively doubled. This type of memory device is referred to as a double data rate (DDR) SDRAM. In a DDR SDRAM, a data strobe signal, commonly referred to as "DQS", is used in conjunction with the system clock to strobe and clock memory data.

The DDR SDRAM also utilizes a 4-bit prefetch data processing method. Usually in a write operation of 4-bit prefetch DDR SDRAM, input data, which are arranged in parallel, are input in synchronization with the data strobe signal DQS, and a write command is input in synchronization with an external clock signal. The data are finally stored in a memory cell array. The memory device is characterized by an input/output interface parameter tDQSS. The input/output interface parameter tDQSS occurs due to the difference of domains between the data strobe signal DQS domain and the external clock signal EXTCLK domain.

Figure 1:
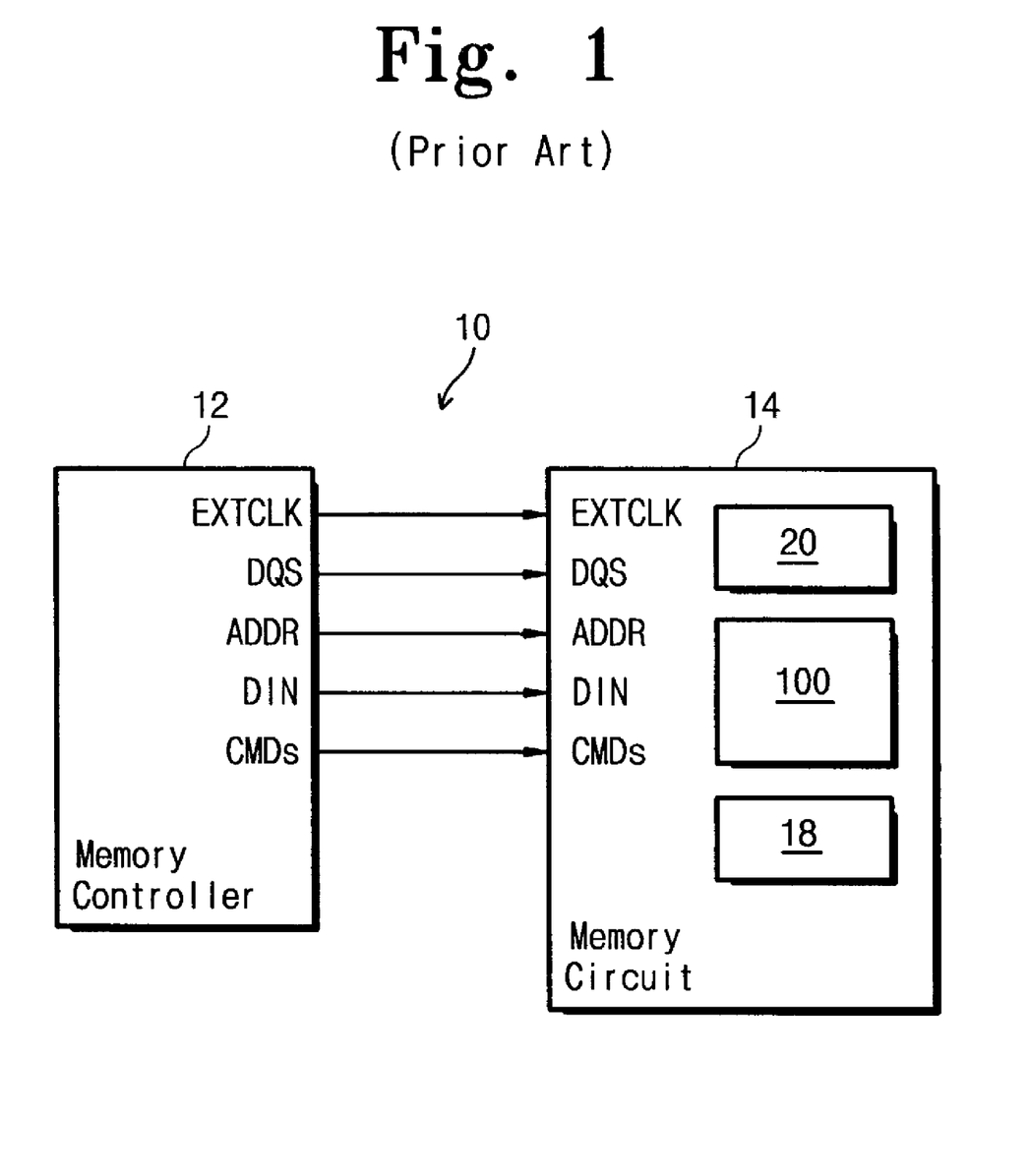
FIG. 1 is a schematic block diagram which illustrates a conventional memory system.

FIG. 1 is a schematic block diagram which illustrates a conventional memory system 10. The system 10 includes a memory controller 12 which provides data and control signals to and from a memory circuit 14, which can be an SDRAM circuit. The memory circuit 14 includes SDRAM storage 18 including SDRAM memory cells, a SDRAM data input circuit 100 which controls the writing of data to the SDRAM memory cells, and other circuitry 20 for carrying out the functions of the memory circuit 14.

The interface between the memory controller 12 and the memory circuit 14 carries address (ADDR) and data (DIN) signals. It also carries various control and timing signals which can include the data strobe signal DQS, the external clock signal EXTCLK and commands (CMDs), which can include a chip select signal (CSB), a row address strobe signal (RASB), a column address strobe signal (CASB), and a write enable signal (WEB).

Figure 2:
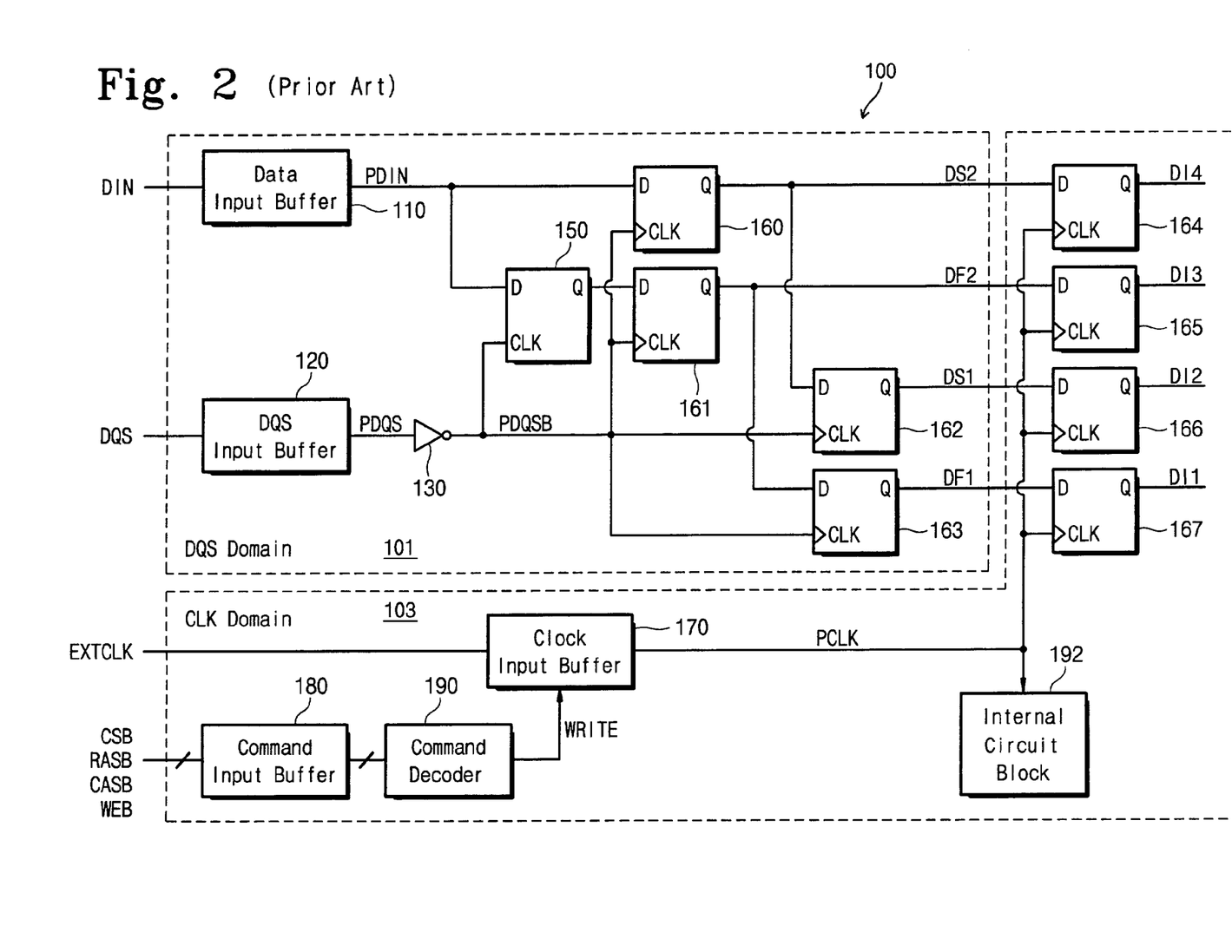
FIG. 2 is a schematic block diagram of a portion of an SDRAM data input circuit illustrated in FIG. 1.

FIG. 2 is a schematic block diagram of a portion of an SDRAM data input circuit 100 illustrated in FIG. 1. Referring to FIG. 2, SDRAM 100 receives the data strobe signal DQS and the external clock signal EXTCLK. Accordingly, the circuit 100 operates in both the DQS domain and the EXTCLK domain and includes circuitry to operate in the two different domains.

The data strobe signal DQS domain circuitry 101 includes a data input buffer 110 inputting the data DIN and outputting internal data input PDIN, a data strobe signal DQS input buffer 120 inputting the data strobe signal DQS and outputting an internal data strobe signal PDQS, an inverter 130 generating an inverted data strobe signal PDQSB, and a plurality of flip-flops.

The clock signal EXTCLK domain circuitry 103 includes a clock input buffer 170 inputting the external clock signal EXTCLK and outputting an internal clock signal PCLK, a plurality of command input buffers 180 inputting command signals such as the chip select signal CSB, row address strobe signal RASB, column address strobe signal CASB, and write enable signal WEB, a command decoder 190 inputting the buffered command signals and outputting an internal write signal WRITE, and an internal circuit block 192 inputting the internal clock signal PCLK. The internal write signal WRITE is input to the clock input buffer 170 and is used in generating the internal clock signal PCLK. Accordingly, the internal clock signal PCLK is in synchronization with the external clock signal EXTCLK. As a result, the internal clock signal PCLK carries information with regard to the timing of a write command.

The data input circuit 100 is shown as a serial-input/parallel-output circuit that operates with a 4-bit prefetch. That is, four bits of serial data are input from DIN through the data input buffer 110 and are output as a internal data PDIN(1-4) to the plurality of flip-flops, which in turn convert the four bits of serial data into four bits of parallel data synchronized with rising and falling edges of the inverted internal data strobe signal PDQSB. The four bits of parallel data are written into a memory array in response to a clock signal derived from a system clock. The system clock and the external clock signal EXTCLK are the same signals in this specification. The input data DIN is sequentially input and arranged in parallel on predetermined internal nodes which are referred to herein as a first group of data lines DF1, DS1, DF2, and DS2, having sequentially input data. The names of nodes may be used as those of signals applied to them.

Figure 3:
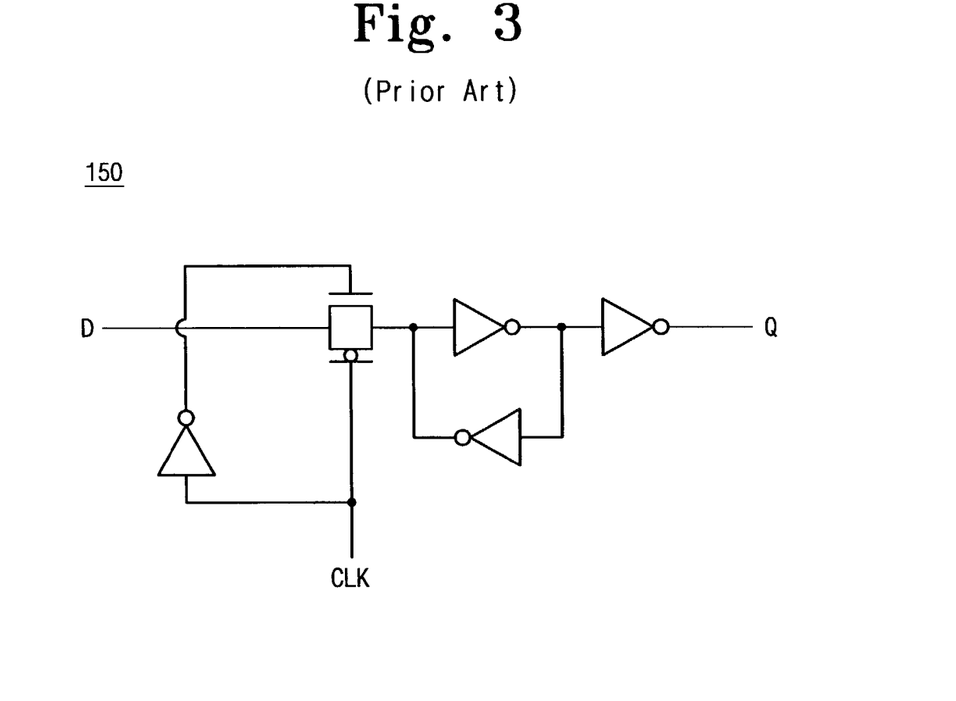
FIG. 3 is a schematic diagram of a flip-flop circuit shown in FIG. 2.
Figure 4:
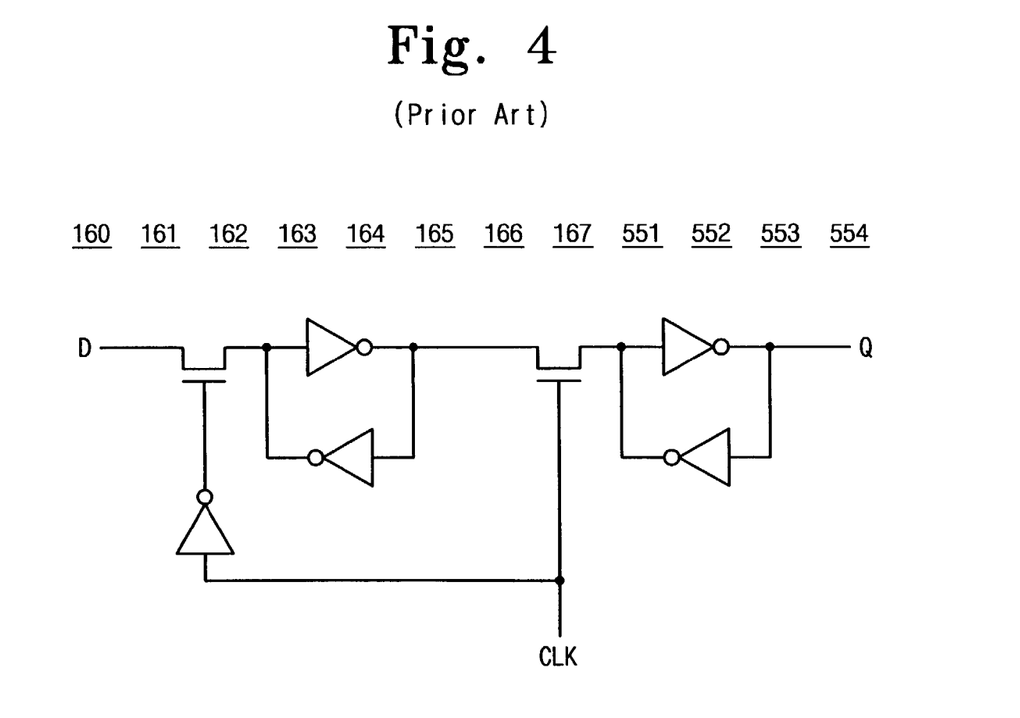
FIG. 4 is a schematic diagram of another flip-flop circuit shown in FIG. 2.

FIG. 3 is a schematic diagram of a flip-flop circuit 150 shown in FIG. 2. The flip-flop circuit 150 latches the internal data input signal PDIN in response to a low level of PDQSB signal. FIG. 4 is a schematic diagram of another flip-flop circuit 160–163 in FIG. 2. The flip-flop 160–163 latches an input signal in response to a low level of the PDQSB signal and outputs the internally latched data in response to a high level of PDQSB. The output data of the flip-flops 160–163 is arranged in a 4-bit parallel configuration. The flip-flops 164–167 have the same structure as those shown in FIG. 4. The data loaded on the first group of data lines DF1, DS1, DF2, and DS2 are prefetched to the second set of data lines DI1, DI2, DI3, and DI4 through flip-flops 164–167 in response to the internal clock signal PCLK. That is, the data on the first group of data lines DF1, DS1, DF2 and DS2 are passed to the second set of data lines DI1, DI2, DI3 and DI4 on a low level of the PCLK signal. The second data lines DI1, DI2, DI3, and DI4 are processed in parallel fashion and written into the memory cell array.

In the SDRAM 100, the reference signal that arranges the 4-bit data on the first data lines is the data strobe signal DQS, and the reference signal that prefetchs data in parallel on the second data lines is the internal clock signal PCLK which includes the timing of the write command. That is, arranging the 4-bit data on the first data lines occurs in the data strobe signal DQS domain, and parallel prefetching the 4-bit data occurs in the external clock EXTCLK domain. Accordingly, the input/output interface parameter tDQSS is defined to characterize the difference in the domains.

Figure 5A:
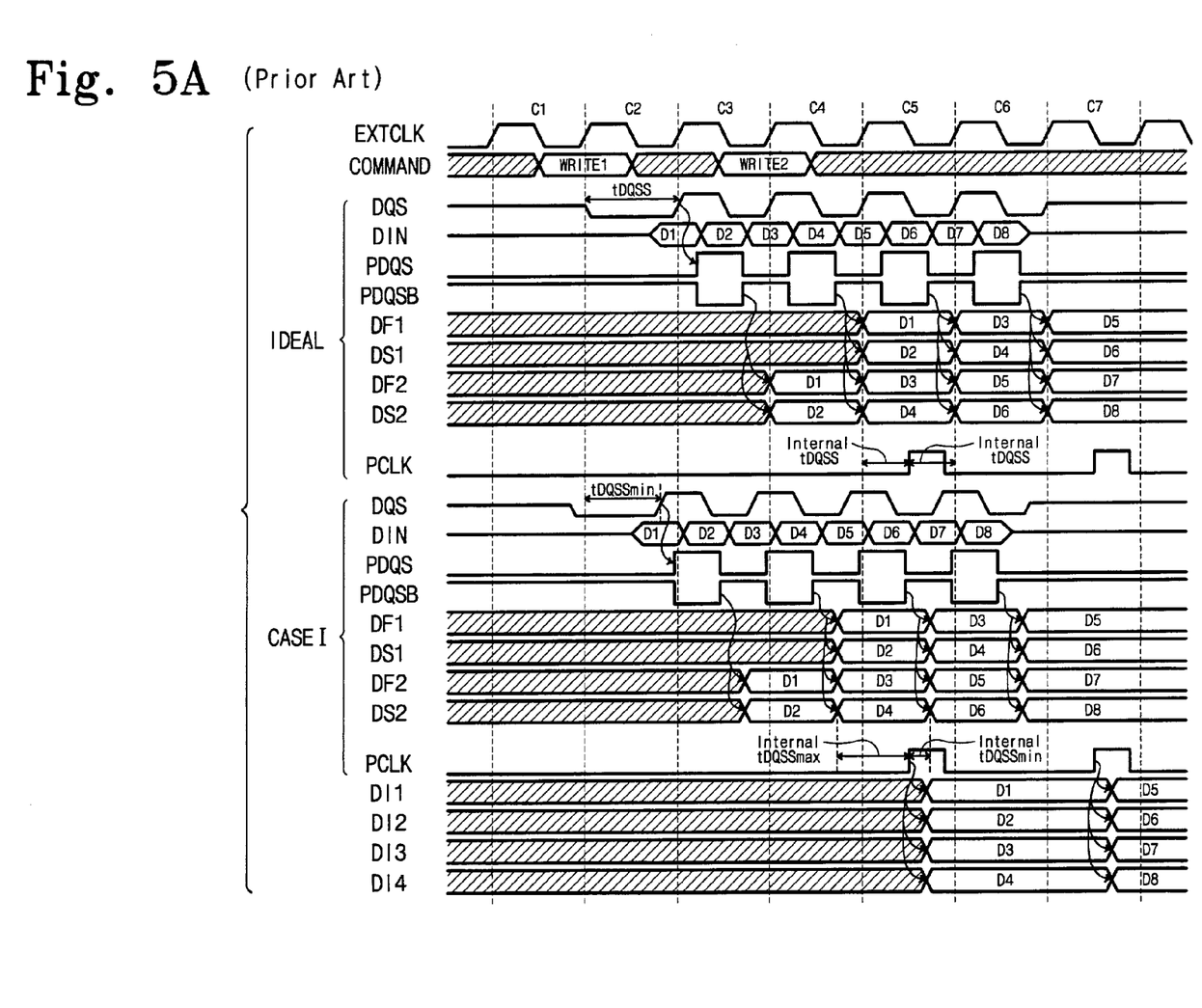
FIGS. 5A and 5B contain timing diagrams showing the write operation of FIG. 2.
Figure 5B:
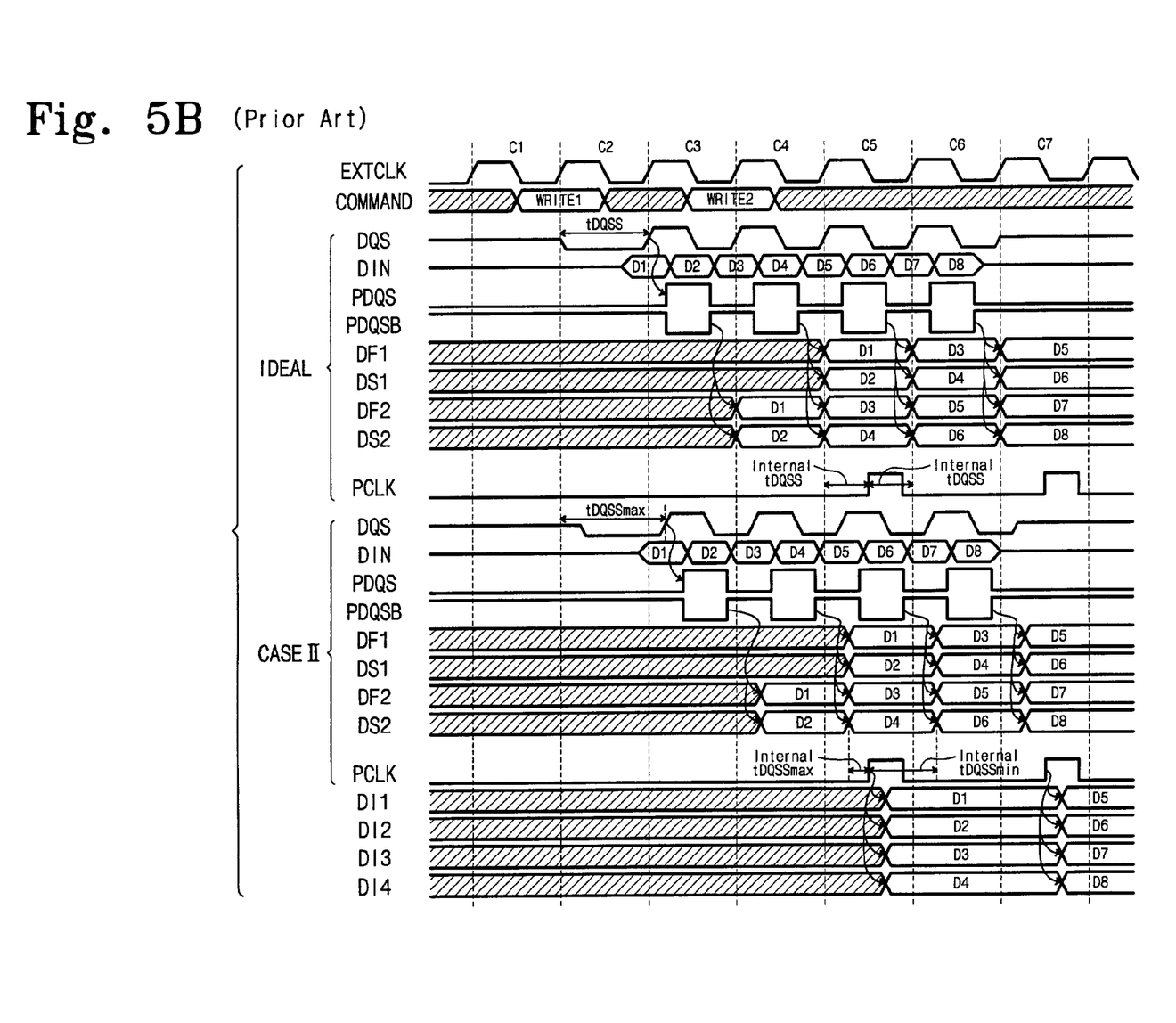

FIGS. 5A and 5B contain timing diagrams showing the write operation of FIG. 2. Referring to FIGS. 5A and 5B, at a C2 clock cycle and C4 clock cycle first and second write commands WRITE1 and WRITE2 are input, respectively. The data strobe signal DQS is input from C3 clock cycle. The input data DIN D1 to D8 are input in synchronization with the rising and falling edges of data strobe signal DQS. The data D1 to D4 are serially input with the first write command WRITE1. The data D5 to D8 are serially input with the second write command WRITE2. At every rising edge of the inverted internal data strobe signal PDQSB, the data loaded are: unknown-unknown-D1-D2, D1-D2-D3-D4, D3-D4-D5-D6, D5-D6-D7-D8. Thereafter the first data lines DF1, DS1, DF2, and DS2 are loaded to the second data lines DI1, DI2, DI3, and DI4 in response to the internal clock signal PCLK.

FIGS. 5A and 5B illustrate two cases, i.e., Case I and Case II, respectively, with regard to the relative timing between the occurrence of the data strobe signal DQS and that of the external clock signal EXTCLK. FIGS. 5A and 5B also illustrate an ideal case for comparison purposes. The parameter tDQSS is illustrated in the diagrams as the time between the occurrence of a rising edge of the external clock signal EXTCLK with a write command and the occurrence of the first rising edge of the data strobe signal DQS. In the ideal case, the rising edge of the DQS signal occurs simultaneously with the rising edge of the EXTCLK signal at the beginning of the C3 clock cycle. The parameter tDQSSmin of Case I (FIG. 5A) illustrates a time interval or delayed DQS in which DQS occurs prior to the rising edge of EXTCLK at C3, and tDQSSmax of Case II (FIG. 5B) illustrates a time interval or delayed DQS in which DQS occurs after the rising edge of EXTCLK at C3.

Referring to Case II in FIG. 5B, as tDQSSmax increases, an internal tDQSSmax parameter decreases. Referring to Case I in FIG. 5A, as tDQSSmin decreases, an internal tDQSSmin decreases. The internal tDQSSmax and internal tDQSSmin parameters are measures of the internal timing margins, i.e., internal margin 1 (IM1) and internal margin 2 (IM2), respectively, of the PCLK signal in the memory write fetch window. If either of these timing margins of the internal clock signal PCLK is reduced, high frequency operation of the circuit can deteriorate. That is, under Case II, if the timing margin IM1 (internal tDQSSmax) is substantially reduced, set-up time requirements of the circuitry, e.g., the flip-flops 164–167, may be violated, resulting in failure of the circuit. On the other hand, under Case I, if the timing margin IM2 (internal tDQSSmin) is substantially reduced, hold time requirements of the circuitry, e.g., the flip-flops 164–167, may be violated, also resulting in failure of the circuit. Accordingly, as the frequency of operation of the circuit increases, these problems are exacerbated.

Here, to prefetch the data D1, D2, D3, and D4 on the first data lines DF1, DS1, DF2, and DS2, the internal clock signal PCLK has to be generated between the data starting timing point and data ending timing point. The greater the timing margins of the tDQSSmax and tDQSSmin parameters, the better the frequency characteristic of the memory device will be. However, the higher the operation frequency is, the worse the timing margins of the parameters tDQSSmax/min are. If the amount of data is large, the variation of process, voltage, and temperature (PVT) is greater and the timing margin of tDQSS is reduced. Also, because of these variations, the circuit is more difficult for engineers to design.

Thus, it would be desirable to have semiconductor devices without the input/output interface parameter tDQSS to allow a write operation to be performed reliably at a high frequency range.

SUMMARY OF THE INVENTION

In one aspect, the invention is directed to a semiconductor memory system and method. The memory system includes a memory control circuit for generating a data strobe signal and a data load signal such that the data load signal is synchronous with the data strobe signal. The system also includes a memory circuit that stores data. The memory circuit receives the data strobe signal and the data load signal and writes data in response to the data strobe signal and the data load signal.

In one embodiment, the memory circuit includes a SDRAM memory circuit. The memory circuit can include a load signal generation circuit for generating a parallel load signal in response to the data load signal. The memory control circuit can include a data load signal generating circuit for generating the data load signal. The data load signal generating circuit generates the data load signal in synchronization with the data strobe signal.

In another aspect, the invention is directed to a memory control circuit and method for controlling a semiconductor memory device. The memory control circuit includes a data strobe signal generator for generating a data strobe signal, a data load signal generator for generating a data load signal such that the data strobe signal and the data load signal are synchronous, and an interface for providing the data strobe signal and the data load signal to the semiconductor memory device to write data into the semiconductor memory device.

In another aspect, the invention is directed to a semiconductor memory device. The semiconductor memory device of the invention includes an interface for receiving a data strobe signal and a data load signal, the data strobe signal and the data load signal being synchronous with each other. The memory device of the invention also includes a storage circuit for writing data into the semiconductor memory device in response to the data strobe signal and the data load signal.

In accordance with the invention, because the data strobe signal and data load signal are in synchronization with each other, the tDQSS parameters in the prior art are eliminated. Accordingly, internal timing margins in load signals are balanced. As a result, functional parameters of circuitry, such as set-up and hold times, are not violated. Accordingly, high-frequency operation of the circuit and system is greatly improved.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Figure 6:
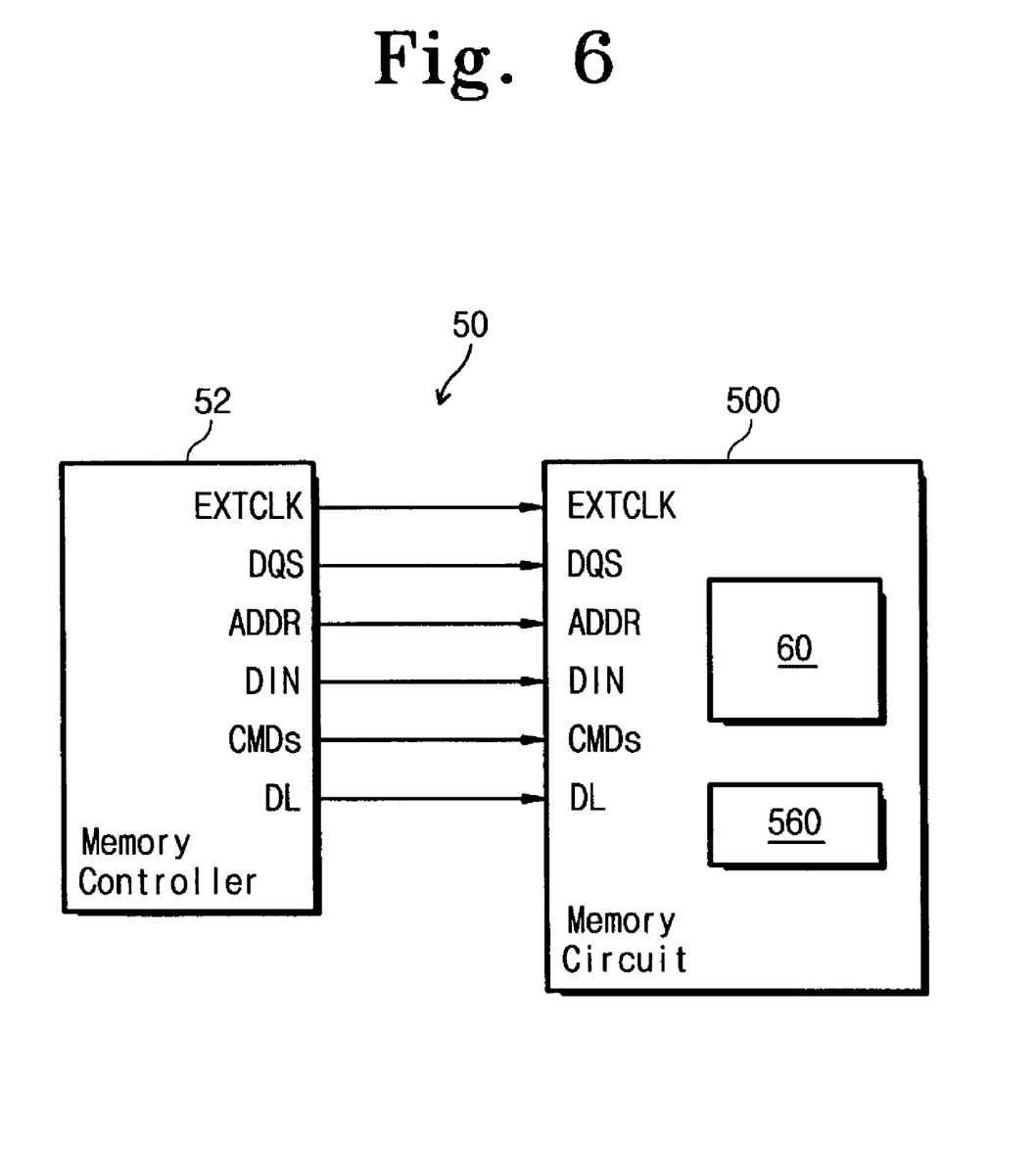
FIG. 6 is a schematic block diagram which illustrates a memory system in accordance with an embodiment of the present invention.

FIG. 6 is a schematic block diagram which illustrates a memory system 50 in accordance with an embodiment of the present invention. The system 50 includes a memory controller 52 which provides data and control signals to and from a memory circuit 500, which can be an SDRAM circuit. The memory circuit 500 includes SDRAM storage 560 including SDRAM memory cells and SDRAM data input and control circuitry 60 which controls the writing of data to the SDRAM memory cells and other functions of the memory circuit 500.

The interface between the memory controller 52 and the memory circuit 500 carries address (ADDR) and data (DIN) signals. It also carries various control and timing signals which can include a data strobe signal DQS, an external clock signal EXTCLK and commands (CMDs), which can include a chip select signal (CSB), a row address strobe signal (RASB), a column address strobe signal (CASB), and a write enable signal (WEB). In accordance with the invention, the interface between the memory controller 52 and the memory circuit 500 also includes an external data load signal DL which is synchronized with the data strobe signal DQS. The external DL signal is used to synchronize latching of data in the memory circuit 500 to the DQS signal such that the parameter tDQSS is eliminated and, as a result, the fetch window internal margin parameters are equal. This results in greatly improved high-frequency performance of the system.

Figure 7:
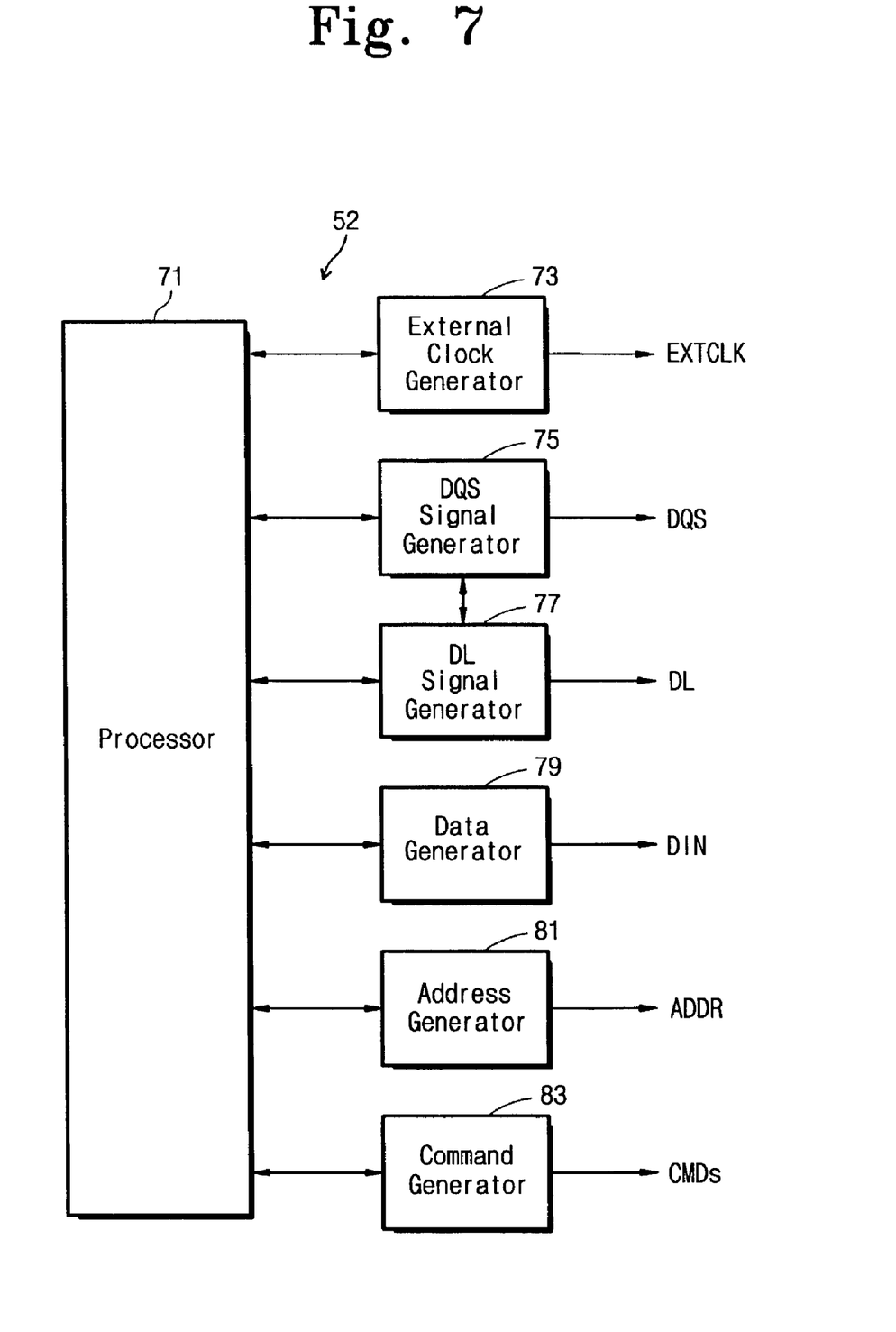
FIG. 7 is a schematic block diagram of one embodiment of the memory controller of FIG. 6.

FIG. 7 is a schematic block diagram of one embodiment of the memory controller 52 of FIG. 6. The memory controller 52 includes a processor 71 which can interface with the remaining circuitry as shown. The controller 52 also includes an external clock generator 73 for generating and outputting the EXTCLK signal, a DQS signal generator 75 for generating and outputting the DQS signal, a DL signal generator 77 for generating and outputting the DL signal, a data generator 79 for generating and outputting the DIN signals, an address generator 81 for generating and outputting the address signals ADDR, and a command generator 83 for generating and outputting the various command signals used by the system. It is noted that although separate signal generation circuitry is illustrated for each signal or set of signals, the signal generation circuits may be combined, and/or some or all of the signal generation functionality may be realized by the processor 71. The DQS signal generator 75 and the DL signal generator 77 are shown interfaced to each other because the DL signal is generated in synchronization with the DQS signal. The various signals are forwarded to the memory circuit 54 of the invention as shown in FIG. 6.

Figure 8:
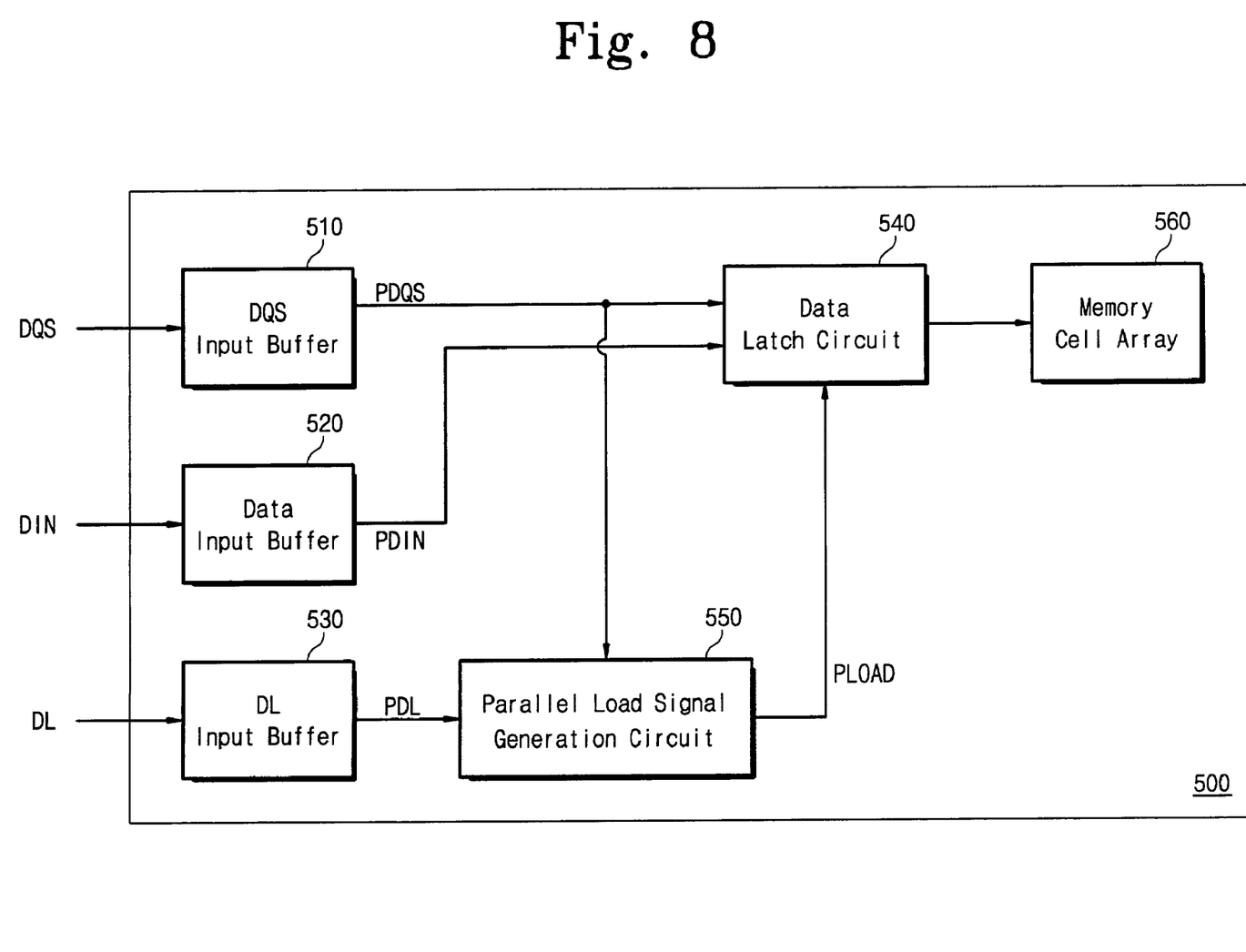
FIG. 8 contains a schematic block diagram of an embodiment of the SDRAM memory circuit in accordance with the present invention.

FIG. 8 contains a schematic block diagram of an embodiment of the SDRAM memory circuit 500 in accordance with the present invention. Referring to FIG. 8, the SDRAM 500 includes a DQS input buffer 510 inputting the data strobe signal DQS and outputting an internal data strobe signal PDQS, a data input buffer 520 inputting data DIN and outputting internal input data PDIN, a data load DL input buffer 530 inputting a data load signal DL and outputting an internal data load signal PDL, a data latch circuit 540, a parallel load signal generation circuit 550, and memory cell array 560. The data strobe signal DQS input buffer 510, data input buffer 520, and data load input buffer 530 are structured as conventional input buffers. The DQS input buffer 510 buffers the data strobe signal DQS, the data input buffer 520 buffers data DIN, and the data load input buffer 530 buffers the data load signal DL to generate the internal signals PDQS, PDIN and PDL, respectively.

The data latch circuit 540 loads the internal data input PDIN from the output of the data input buffer 520 sequentially in response to the internal data strobe signal PDQS and transfers the output to memory cell array 560 in response to the parallel load signal PLOAD from the output of the parallel load signal generator circuit 550. The parallel load signal generation circuit 550 receives the internal data load signal PDL from the output of the data load input buffer 530 and generates a parallel load signal PLOAD in response to the internal data strobe signal PDQS output from the DQS input buffer 510.

Figure 9:
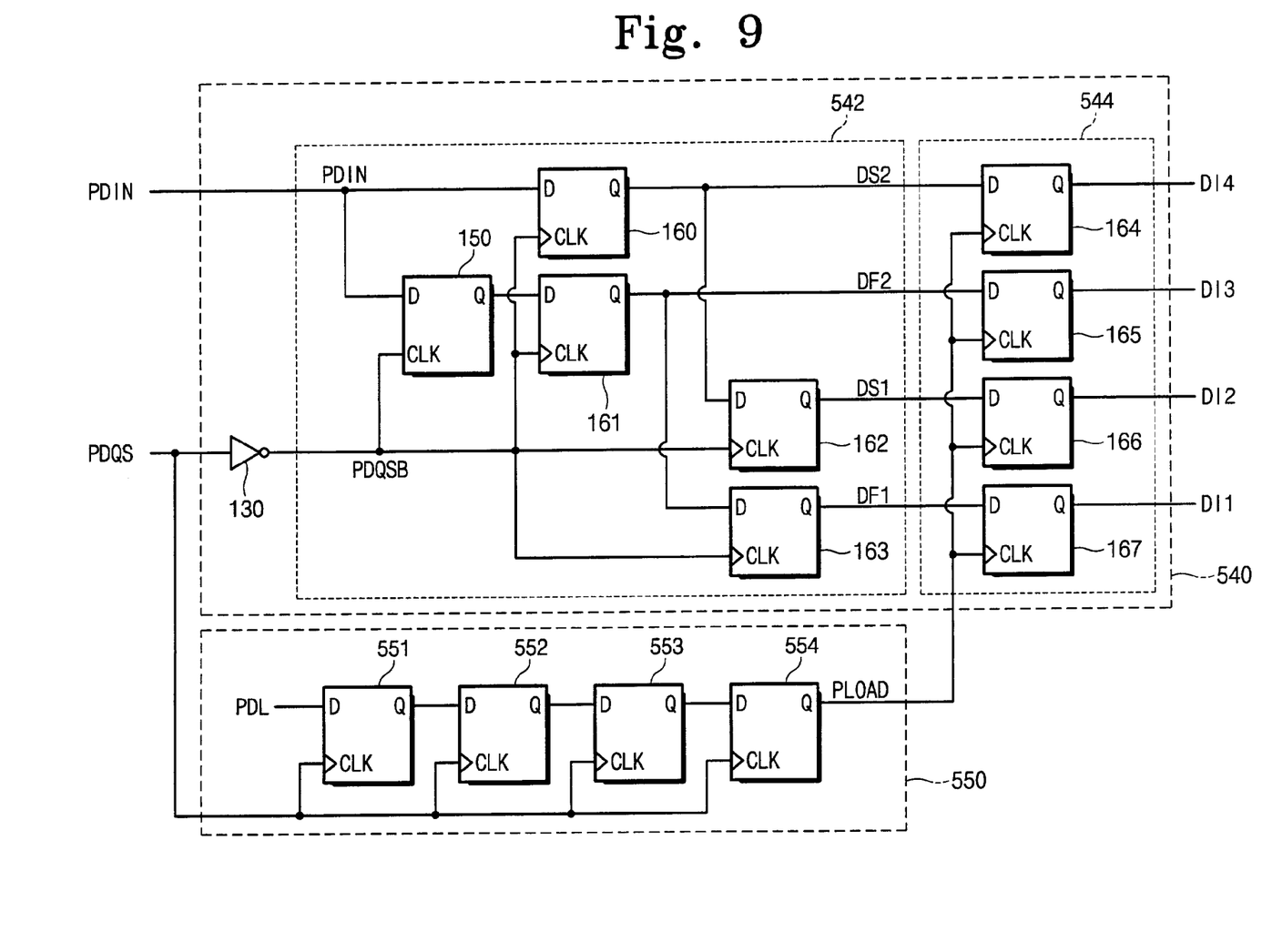
FIG. 9 contains a schematic block diagram of the data latch circuit and the parallel load signal generation circuit in FIG. 8.

FIG. 9 contains a schematic block diagram of the data latch circuit 540 and the parallel load signal generation circuit in FIG. 8. As shown in FIG. 9, the data latch circuit 540 includes an inverter 130 which generates an inverted internal data strobe signal PDQSB, a data loading circuit 542 which loads the internal data PDIN on the first group of data lines DF1, DS1, DF2, and DS2 in response to the inverted internal data strobe signal PDQSB, and a data patch circuit 544 which prefetches and latches the data on the first group of data lines and transfers the latched data to the second group of data lines in response to the parallel load signal PLOAD.

The data loading circuit 542 includes a plurality of flip-flops 150 and 160–163. The first flip-flop 150 has the same structure as that of the flip-flop shown in FIG. 3. It latches the internal data input PDIN in response to a high level of the internal data strobe signal PDQSB. The other flip-flops have the same structure as that of the flip-flop shown in FIG. 4. The second flip-flop 160 latches the data PDIN in response to a low level of the inverted internal data strobe signal PDQSB and loads the latched data to the fourth data line DS2 of the first group in response to the successive high level of the inverted internal data strobe signal PDQSB. The third flip-flop 161 latches the output of the first flip-flop 150 in response to the low level of the inverted internal data strobe signal PDQSB and loads the latched data to the third data line DF2 of the first group in response to the successive high level of PDQSB. The fourth flip-flop 162 latches the output of the first flip-flop 150 in response to the low level of the inverted internal data strobe signal PDQSB and loads the latched data to the second data line DS1 of the first group in response to the successive high level of PDQSB. The fifth flip-flop 163 latches the output of the first flip-flop 150 in response to the low level of the inverted internal data strobe signal PDQSB and loads the latched data to the fourth data line DF1 of the first group in response to the successive high level of PDQSB.

The data patch circuit 544 latches the data DF1, DS1, DF2, and DS2 on the first group of data lines and transfers the latched data to the second group data lines DI1, DI2, DI3, and DI4. The sixth to ninth flip-flops 164–167 have the same structure as the flip-flop shown in FIG. 4. The data on the second data lines DI1, DI2, DI3, and DI4 is stored in memory cell array 560. Data patch circuit 544 includes a sixth flip-flop 164 which latches the data on the first data line of the first group in response to the parallel load signal PLOAD, a seventh flip-flop 165 which latches the data on the second data line of the first group in response to the parallel load signal PLOAD, an eighth flip-flop 166 which latches the data on the third data line of the first group in response to the parallel load signal PLOAD, a ninth flip-flop 167 which latches the data on the fourth data line of the first group in response to the parallel load signal PLOAD.

The parallel load signal generation circuit 550 latches the internal data load signal PDL in response to the internal data strobe signal PDQS and generates the parallel load signal PLOAD. The parallel load signal PLOAD is activated at the fourth rising edge of the internal data strobe signal PDQS. The parallel load signal generation circuit includes a tenth flip-flop 551 which latches the data load signal DL (internal data load signal PDL) in response to the data strobe signal DQS (internal data strobe signal PDQS), an eleventh flip-flop 552 which latches the output of the tenth flip-flop in response to the data strobe signal, a twelfth flip-flop 553 which latches the output of the eleventh flip-flop in response to the data strobe signal, and a thirteenth 554 flip-flop which latches the output of the twelfth flip-flop in response to the data strobe signal.

The number of flip-flop for activating the parallel load signal PLOAD is defined by the number of write latency and the number of burst data. Write latency is defined as the number of clock cycles in the time interval between initiation of a write command and the first data input. The present invention shows a case where the write latency is one, and the number of burst data is four. Data is input at both the rising and falling edges of data strobe signal DQS, so the parallel load signal PLOAD is activated after passing four flip-flops and prefetchs the parallel data. The number of flip-flops is variable according to the write latency and burst length of the data. The write latency and burst length is defined at the starting power-up sequence. Usually DRAMs use mode register setting (MRS) for these settings.

Figure 10A:
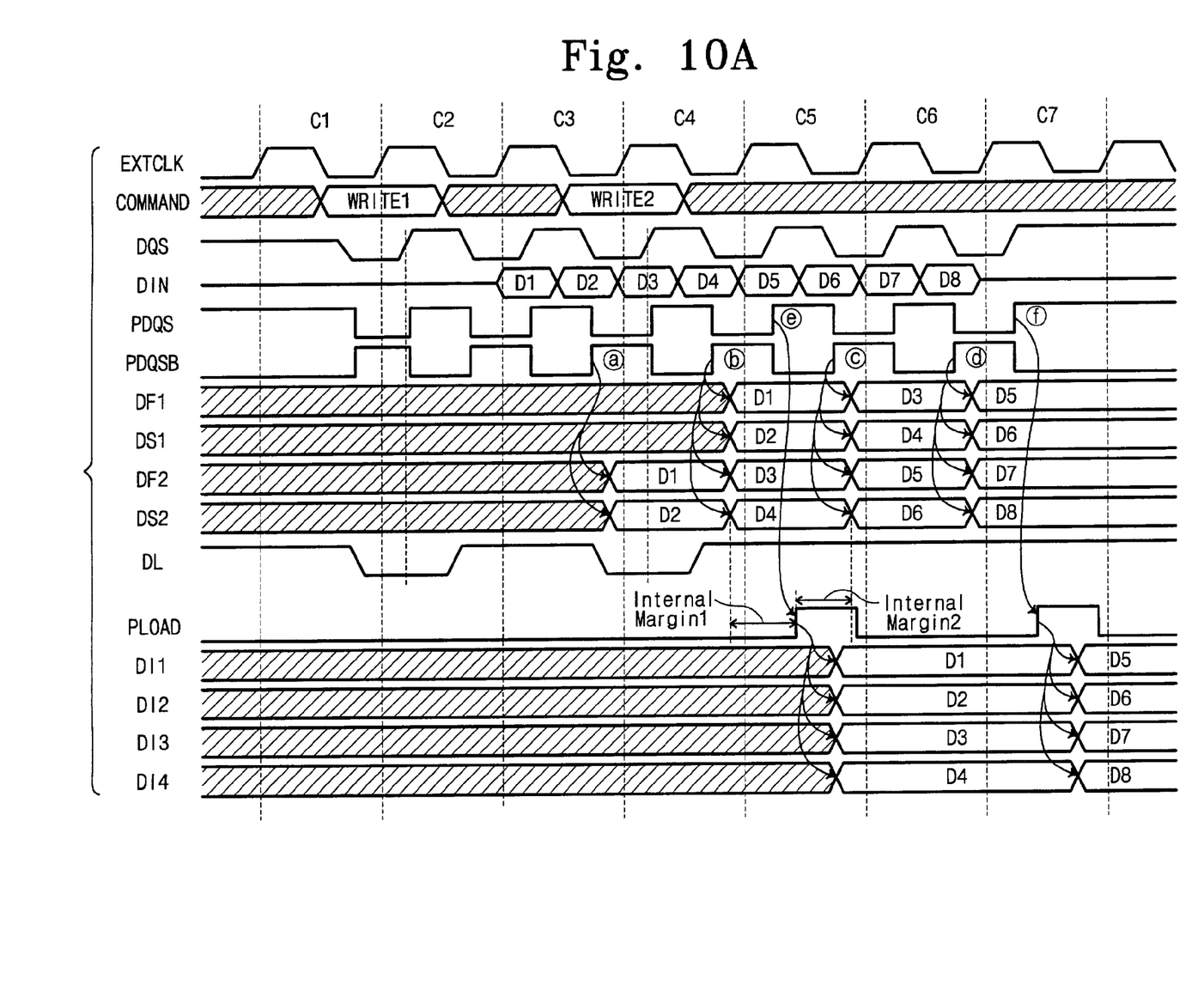
FIG. 10A contains a timing diagram of a write operation in accordance with the present invention.

FIG. 10A contains a timing diagram of a write operation in accordance with the present invention. Referring to FIG. 10A, at the clock cycle C2 the data load signal DL is input together with the first write command WRITE1 in response to the data strobe signal DQS, and at the clock cycle C4 the data load signal DL is input together with the second write command WRITE2 in response to data strobe signal DQS. Write commands WRITE1 and WRITE2 are input at intervals of two cycles of the clock signal EXTCLK. In the case of a DDR SDRAM, input data is input in response to every edge, i.e., rising and falling edges, of the data strobe signal DQS. D1 to D4 data are burst input by the first write command WRITE1. D5 to D8 data are burst input by the second write command WRITE2. Input data DIN and the data load signal DL are input in synchronization with the data strobe signal DQS.

At clock cycle C3, the data D1 and D2 are loaded on the first group of data lines (DF2, DS2) in response to the inverted internal data strobe signal PDQSB. At clock cycle C4, the data D1, D2, D3, and D4 are loaded on the first group of data lines (DF1, DS1, DF2, DS2) in response to the inverted internal data strobe signal PDQSB. At clock cycle C5, the data D3, D4, D5, and D6 are loaded on the first group data lines in response to PDQSB. The data D4 and D5 are input by the successive write command WRITE2. At a clock cycle C6, the data D5, D6, D7, and D8 are loaded on the first group of data lines in response to PDQSB.

At clock cycle C2, the data load signal DL is input together with the first write command WRITE1 in response to the rising edge of the data strobe signal DQS. The signal DL is used by the parallel load signal generation circuit 550 in generating the internal parallel load signal PLOAD at clock cycle C5. Because the parallel load signal generation circuit comprises four flip-flops, PLOAD is activated at clock cycle C5. In one embodiment, the parallel load signal PLOAD is generated by a pulse signal generator (not shown). At clock cycle C4, the data load signal DL is input together with the second write command WRITE2 in response to the rising edge of the data strobe signal DQS, and is used by the parallel load signal generation circuit 550 in generating the internal parallel load signal PLOAD at clock cycle C7.

At clock cycle C5, the parallel load signal PLOAD has the internal timing margins 1 and 2 with the data D1, D2, D3, and D4 on the first group of data lines DF1, DS1, DF2, and DS2. The internal timing margins 1 and 2 are in the same DQS domain because the data load signal DL is input in synchronization with the data strobe signal DQS. The internal margins are of equal time duration. As a result, the possible violation of hold times and set-up times in the prior art systems are eliminated. Accordingly, high-frequency operation is greatly improved. The data D1, D2, D3, and D4 on the first group of data lines are transferred to the second group of data lines DI1, DI2, DI3, and DI4 in response to the parallel load signal PLOAD. The remainder of the operation at the C7 clock cycle is similar to that of the C5 clock cycle, so it will not be described.

As a result, the input/output parameter tDQSS min/max between DQS and EXTCLK does not exist is the circuit of the invention, and the data strobe signal DQS and data load signal DL are always input in synchronization. As a result, the timing margin is broader than that of the prior art.

Figure 10B:
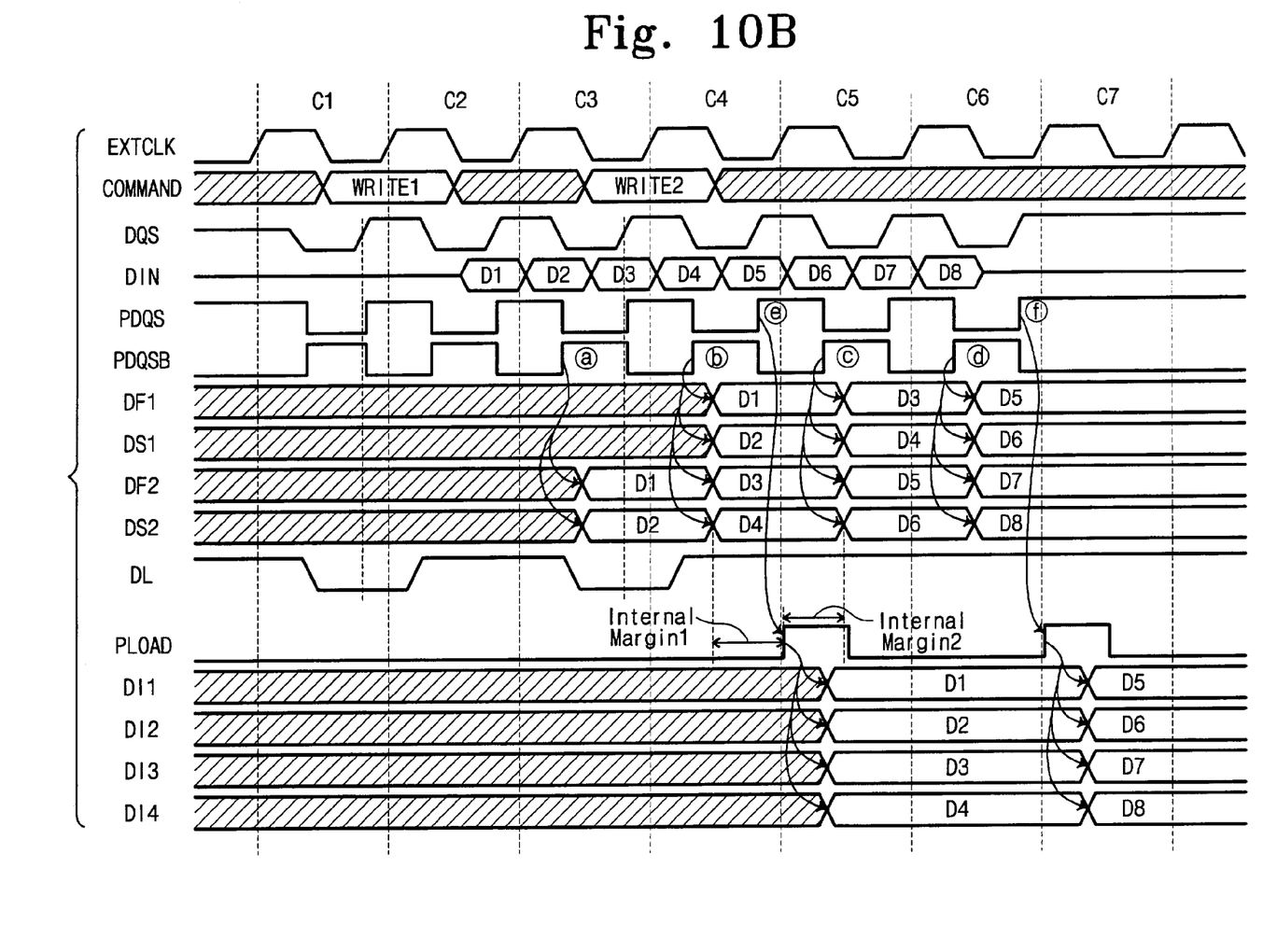
FIG. 10B is a timing diagram illustrating variation of the activation timing of the parallel load signal PLOAD in the write operation illustrated in FIG. 10A.

FIG. 10B is a timing diagram illustrating variation of the activation timing of the parallel load signal PLOAD. The parallel load signal PLOAD activation timing is varied with the timing variation of the first group of data lines as shown in FIG. 10B. The operation of the system under the conditions illustrated in FIG. 10B is similar to that of FIG. 10A, so repetition of the description will be omitted.

While this invention has been particularly shown and described with reference to preferred embodiments thereof, it will be understood by those skilled in the art that various changes in form and details may be made therein without departing from the spirit and scope of the invention as defined by the appended claims.

The invention claimed is:

1. A semiconductor memory system, comprising:
   a memory control circuit for generating a data strobe signal and a data load signal, the data load signal being synchronous with the data strobe signal; and a memory circuit, comprising:
  a memory array for storing data; and
  a parallel load signal generating circuit which receives the synchronized data strobe signal and data load signal and generates a parallel load signal in response to both the data strobe signal and the data load signal, the parallel load signal being applied in the memory circuit to write data to the memory array in response to the parallel load signal, the parallel load signal generating circuit comprising a plurality of storage circuits connected in series that activate the parallel load signal, wherein all of the storage circuits receive the data strobe signal simultaneously, and a first storage circuit of the plurality of storage circuits receives the data load signal.

2. The semiconductor memory system of claim 1, wherein the memory circuit comprises a SDRAM memory circuit.

3. The semiconductor system of claim 1, wherein the number of storage circuits is determined by a quantity of data input to the memory control circuit by a write command.

4. The semiconductor memory system of claim 1, wherein the memory control circuit comprises a data load signal generating circuit for generating the data load signal.

5. The semiconductor memory system of claim 4, wherein the data load signal generating circuit generates the data load signal in synchronization with the data strobe signal.

6. A method of writing data into a semiconductor memory, comprising:
  generating a data strobe signal and a data load signal such that the data strobe signal and the data load signal are synchronous;
  applying the synchronous data strobe signal and data load signal to a parallel load signal generating circuit, the parallel load signal generating circuit generating a parallel load signal from a plurality of storage circuits that activate the parallel load signal, the storage circuits connected in series, and the parallel load signal generated in response to both the data strobe signal and the data load signal, wherein all of the storage circuits receive the data strobe signal simultaneously, and a first storage circuit of the plurality of storage circuits receives the data load signal; and
  applying the parallel load signal in the semiconductor memory to write a quantity of data into the semiconductor memory in response to the parallel load signal.

7. The method of claim 6, wherein the memory circuit comprises a SDRAM memory circuit.

8. A semiconductor memory device, comprising:
  an interface for receiving a data strobe signal and a data load signal, the data strobe signal and the data load signal being synchronous with each other;
  an SDRAM storage circuit for storing data;
  a storage circuit for writing data into the SDRAM storage circuit in response to the data strobe signal and the data load signal;
  a parallel load signal generation circuit for receiving the data strobe signal and the data load signal and generating a parallel load signal in response to the data strobe signal and the data load signal, the parallel load signal generating circuit comprising a plurality of storage circuits that activate the parallel load signal, the storage circuits connected in series, wherein all of the storage circuits receive the data strobe signal simultaneously, and a first storage circuit of the plurality of storage circuits receives the data load signal; and
  a data latch circuit for receiving the parallel load signal and latching a quantity of data to be stored in the SDRAM storage circuit in response to the parallel load signal.

9. A method of writing data into a semiconductor memory device, comprising:
  providing an interface for receiving a data strobe signal and a data load signal, the data strobe signal and the data load signal being synchronous with each other;
  providing an SDRAM storage circuit for storing data;
  providing a storage circuit for writing data into the SDRAM storage circuit in response to the data strobe signal and the data load signal;
  providing a parallel load signal generation circuit for receiving the data strobe signal and the data load signal and generating a parallel load signal from a plurality of storage circuits that activate the parallel load signal, the storage circuits connected in series in response to the data strobe signal and the data load signal, wherein all of the storage circuits receive the data strobe signal simultaneously, and a first storage circuit of the plurality of storage circuits receives the data load signal; and
  providing a data latch circuit for receiving the parallel load signal and latching a quantity of data to be stored in the SDRAM storage circuit in response to the parallel load signal.

10. A semiconductor memory system, comprising:
  a memory control circuit comprising:
  a data strobe signal generating circuit for generating a data strobe signal, and
  a data load signal generating circuit for generating a data load signal, the data load signal being synchronous with the data strobe signal; and
  a memory circuit for storing data, the memory circuit comprising:
  an SDRAM memory circuit,
  an interface for receiving the data load signal and the data strobe signal from the memory control circuit,
  a parallel load signal generating circuit which receives the synchronized data strobe signal and data load signal and generates a parallel load signal in response to both the data strobe signal and the data load signal, the parallel load signal generating circuit comprising a plurality of storage circuits connected in series that activate the parallel load signal, wherein all of the storage circuits receive the data strobe signal simultaneously, and a first storage circuit of the plurality of storage circuits receives the data load signal, and
  a writing circuit for generating a write command and writing a quantity of data into the SDRAM memory circuit in response to the parallel load signal.

11. A method of writing data into a semiconductor memory comprising:
  providing a memory control circuit having a data strobe signal generating circuit for generating a data strobe signal, and a data load signal generating circuit for generating a data load signal, the data load signal being synchronous with the data strobe signal; and
  providing a memory circuit for storing data, the memory circuit having an SDRAM memory circuit, an interface for receiving the data load signal and the data strobe signal from the memory control circuit, a parallel load signal generation circuit which receives the synchronized data strobe signal and data load signal and generates a parallel load signal from a plurality of storage circuits that activate the parallel load signal; the storage circuits connected in series, and the parallel load signal generated in response to both the data strobe signal and the data load signal, wherein all of the storage circuits receive the data strobe signal simultaneously, and a first storage circuit of the plurality of storage circuits receives the data load signal, and a writing circuit for writing data into the SDRAM memory circuit in response to the parallel load signal.

12. A memory control circuit for controlling a semiconductor memory device, comprising:
a data strobe signal generator for generating a data strobe signal;
a data load signal generator for generating a data load signal such that the data strobe signal and the data load signal are synchronous; and
an interface for providing the data strobe signal and the data load signal to the semiconductor memory device to write data into the semiconductor memory device, the interface comprising a plurality of storage circuits connected in series that activate a parallel load signal, wherein all of the storage circuits receive the data strobe signal simultaneously, and a first storage circuit of the plurality of storage circuits receives the data load signal.

13. The memory control circuit of claim 12, wherein the semiconductor memory device comprises a SDRAM memory circuit.

14. A semiconductor memory device, comprising:
an interface for receiving a data strobe signal and a data load signal, the data strobe signal and the data load signal being synchronous with each other;
a parallel load signal generating circuit which receives the synchronized data strobe signal and data load signal and generates a parallel load signal in response to both the data strobe signal and the data load signal, wherein the parallel load signal generating circuit comprises a plurality of storage circuits that activate the parallel load signal, the storage circuits connected in series, wherein all of the storage circuits receive the data strobe signal simultaneously, and a first storage circuit of the plurality of storage circuits receives the data load signal;
a storage circuit for receiving the parallel load signal and writing a quantity of data into the semiconductor memory device in response to the parallel load signal.

15. The semiconductor memory device of claim 14, wherein the memory device comprises a SDRAM memory circuit.

16. The semiconductor memory device of claim 14, wherein the data strobe signal and the data load signal are generated by a memory control circuit interfaced to the semiconductor memory device.

17. The semiconductor memory device of claim 14, further comprising a data latch circuit for latching data to be stored in the semiconductor memory device.

18. A method of writing data into a semiconductor memory device, comprising:
receiving a data strobe signal and a data load signal, the data strobe signal and the data load signal being synchronous with each other;
receiving the synchronous data strobe signal and data load signal and generating a parallel load signal from a plurality of storage circuits that activate the parallel load signal, the storage circuits connected in series, and the parallel load signal generated in response to both the data strobe signal and the data load signal, wherein all of the storage circuits receive the data strobe signal simultaneously, and a first storage circuit of the plurality of storage circuits receives the data load signal;
receiving the parallel load signal and writing a quantity of data into the semiconductor memory device in response to the parallel load signal.

19. The method of claim 18, wherein the memory device comprises a SDRAM memory circuit.

20. The method of claim 18, wherein the data strobe signal and the data load signal are generated by a memory control circuit interfaced to the semiconductor memory device.

21. The method of claim 18, wherein the memory circuit comprises a data latch circuit for latching data to be stored in the semiconductor memory device.

* * * * *